United States Patent [19]

Chamberlain

[11] Patent Number: 5,163,025

[45] Date of Patent: Nov. 10, 1992

[54] PROTECTION CIRCUIT FOR NON-VOLATILE MEMORY

[75] Inventor: William Chamberlain, Lombard, Ill.

[73] Assignee: Zenith Electronics Corporation, Glenview, Ill.

[21] Appl. No.: 614,818

[22] Filed: Nov. 16, 1990

[51] Int. Cl.[5] ............................................. G11C 13/00
[52] U.S. Cl. ...................................... 365/226; 365/228
[58] Field of Search ................ 365/226, 227, 228, 203

[56] References Cited

U.S. PATENT DOCUMENTS 4,999,516  3/1991  Suter et al. ........................... 365/227
5,121,358  6/1992  Slemmer .............................. 365/226

Primary Examiner—Terrell W. Fears

[57] ABSTRACT

A reset control circuit for an EAROM includes a zener diode coupled across the input of a voltage regulator which supplies operating voltage for the EAROM. The breakdown voltage of the zener diode is greater than the output voltage of the regulator. During turn-on, the reset voltage, which is taken from the zener diode, is held below the low point of its active region until the operating voltage has been established. During turn-off, the operating voltage is maintained until the reset voltage has become inactive, i.e. has dropped below its reset low voltage. The sequencing of operating voltage and reset voltage protects the data in the EAROM.

6 Claims, 2 Drawing Sheets

PROTECTION CIRCUIT FOR NON-VOLATILE MEMORY

BACKGROUND OF THE INVENTION AND PRIOR ART

This invention relates generally to non-volatile memories and particularly to a technique for assuring the integrity of data in a non-volatile memory.

Non-volatile memories do not require an active source of power to retain their contents (data). The invention in particular is directed to a so-called EAROM (electrically alterable read only memory) which is a non-volatile memory that may be programmed and reprogrammed. Such memories are commonly used in television receivers to retain certain tuning information, for example, a viewer's favorite channels, AFC potentials, band switching voltages and the like. The EAROM will retain its memory contents for many thousands of years without application of outside power, but its data is subject to corruption in the event the memory operating voltage and reset voltage are not properly correlated. The reset voltage has an active or effective range from a reset voltage low to a reset voltage high, and it is imperative that the operating voltage be applied to the memory before the reset voltage is in its active range to avoid corruption of the data in the memory.

The present invention circuit is utilized in a small screen portable color television receiver that can operate from a 12 volt automobile or deep cycle type battery and which has a provision for an AC supply voltage. In such a receiver, it is imperative that weight and size be minimized. The reset circuit of the invention requires very little additional size, cost or power.

OBJECTS OF THE INVENTION

A principal object of the invention is to provide a novel protection circuit for a non-volatile memory.

Another object of the invention is to provide a reset circuit for a television receiver having a non-volatile memory.

A further object of the invention is to provide an improved, low cost reset circuit arrangement for a non-volatile memory

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
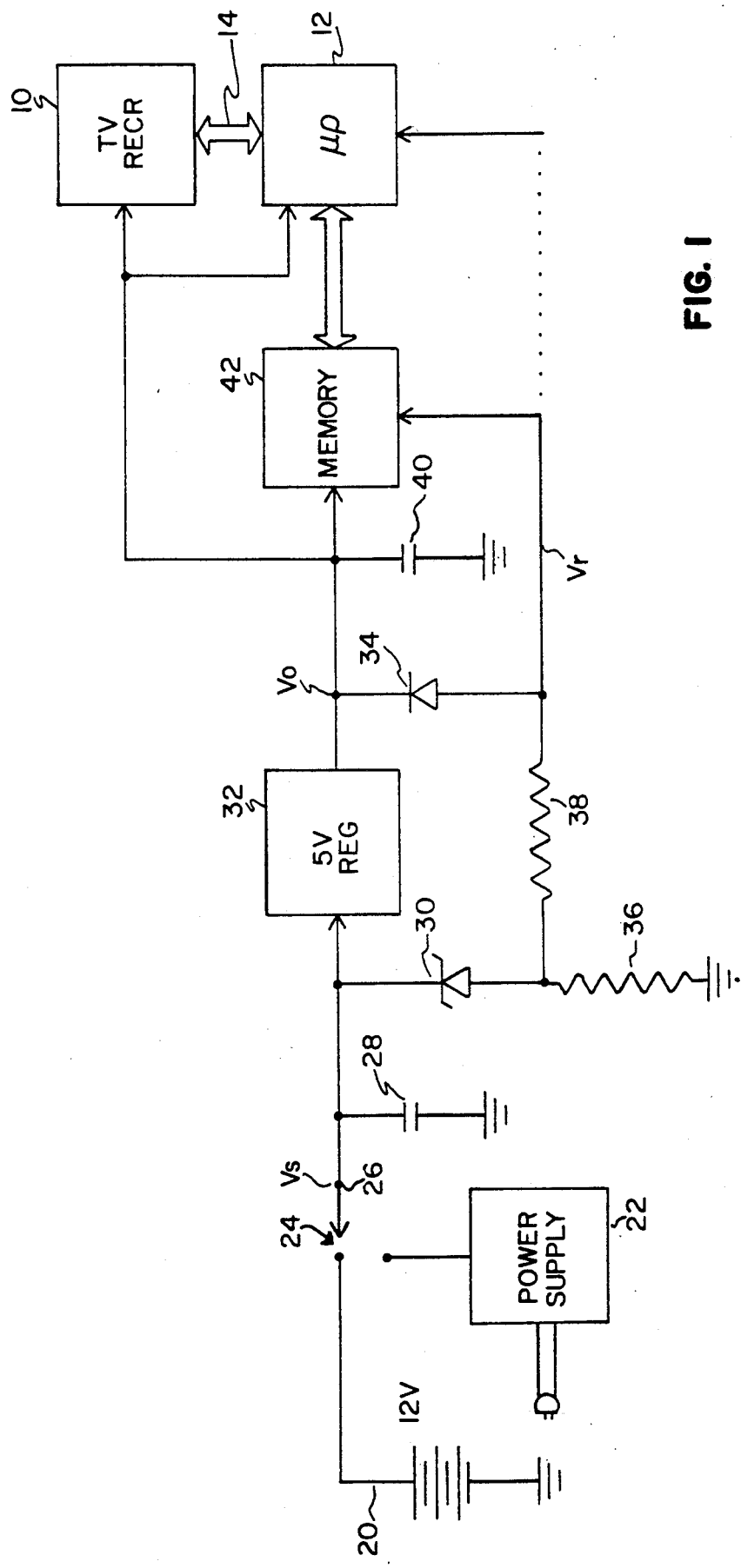
FIG. 1 is a schematic diagram of the reset circuit of the invention.

In FIG. 1, a television receiver is generally indicated by reference numeral 10. A separately denominated microprocessor 12 is coupled to the television receiver by means of a bi-directional communications bus 14. It will be appreciated by those skilled in the art that television receiver 10 physically includes the various elements in the figure, the separate showing being merely to clarify operation of the invention. Both a 12 volt battery source of power 20 and an AC power supply 22 are illustrated. The power sources are coupled to the receiver circuitry via a switch 24 and produce a supply voltage Vs at a terminal 26. Terminal 26 is coupled to a filter capacitor 28, which is returned to ground reference potential, to the input of a 5 volt voltage regulator 32 and to the cathode of a zener diode 30, the anode of which is connected to ground through a resistor 36. The output of regulator 32 is the operating potential Vo and is applied to a filter capacitor 40 that is coupled across the input of a non-volatile memory 42. Vo is also coupled to TV receiver 10 and microprocessor 12 providing operating potentials therefor. The output of voltage regulator 32 is also coupled to the cathode of a diode 34, the anode of which is connected to a resistor 38. Resistor 38 is in turn connected to the junction of zener diode 30 and resistor 36. The reset voltage Vr is developed at the junction of diode 34 and resistor 38 and is applied to memory 42. As indicated by the dashed line, Vr may also be used as a reset voltage for microprocessor 12.

Figure 2:
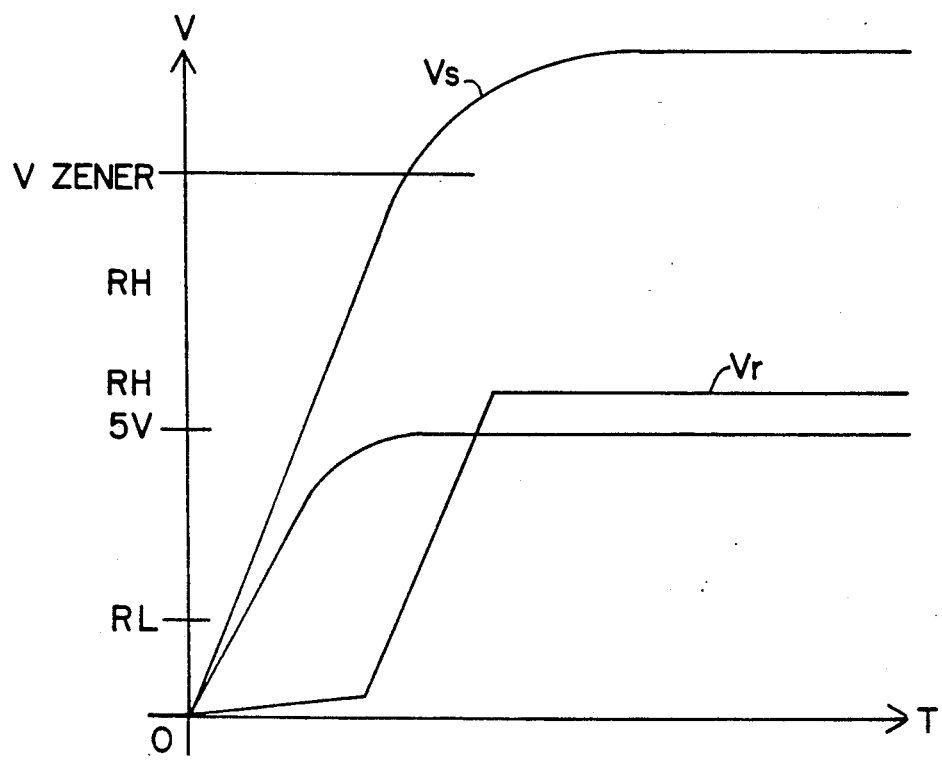
FIG. 2 is a chart showing voltages developed during the television receiver turn-on cycle.
Figure 3:
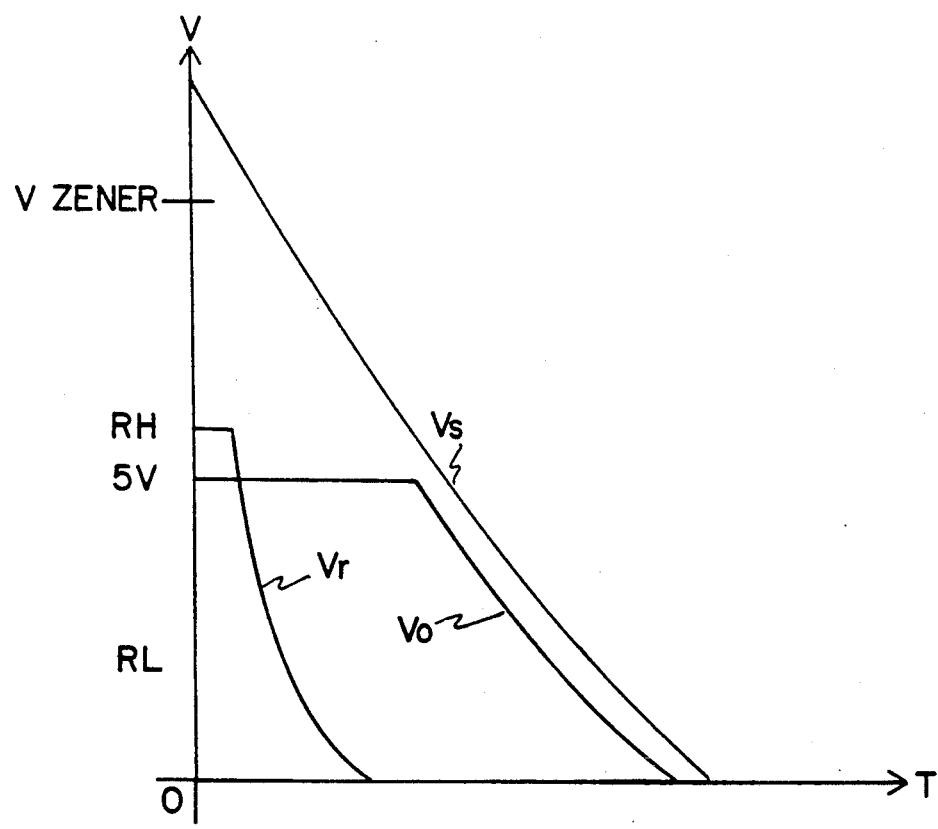
FIG. 3 is a chart illustrating the voltages developed during the television receiver turn-off cycle.

Reference to FIGS. 2 and 3, in conjunction with FIG. 1, should now be made. As illustrated in FIG. 2, which plots voltage against time, the voltage Vs rises to the voltage of battery 20 (or to the output DC voltage of power supply 22) along the curve, substantially as shown. The supply voltage can vary between 10 and 16 volts DC. The operating voltage Vo for the memory (and for the television receiver) rises at almost the same rate to the 5 volt maximum potential permitted by voltage regulator 32. The reset voltage rises very slowly until the zener diode 30 conducts (when Vs reaches 7.5 volts) and then rises at a substantially uniform rate until the reset high voltage is reached. The reset low voltage is indicated by RL and is the maximum voltage at which the reset voltage is considered low. The reset high voltage is indicated by RH and is the minimum voltage at which reset is considered high. The zener diode 30 breakdown voltage of 7.5 volts is indicated on the figures.

In operation, as the Vs voltage rises, Vo follows normally and attains the regulated 5 volts level prior to Vs reaching 7.5 volts, at which point zener diode 30 breaks down and conducts. When this occurs, the voltage across resistor 36 rises until the maximum reset voltage level is reached. This voltage is clamped to a maximum of one-diode-drop above the regulated voltage of 5 volts for protection of EAROM reset input. This voltage level is maintained by the forward breakdown voltage of diode 34. It is seen that the active range of the reset voltage, that is when the reset voltage is between reset low RL and reset high RH, is not encountered until the 5 volt operating potential is applied to the EAROM. Thus the EAROM is protected during the television receiver turn-on cycle.

As shown in FIG. 3, during the television receiver turn-off, the EAROM is also protected since the Vo operating potential is maintained until the reset potential Vr is out of the active range. Upon turn-off, the supply voltage Vs falls along the curve, substantially as indicated, but the 5 volt regulator maintains the Vo potential for a substantial period of time. The reset voltage Vr begins to drop when Vs approaches 7.5 volts (plus the clamped voltage) and falls along the indicated curve and reaches the reset low voltage RL well before the operating voltage Vo begins to fall. Consequently, the conditions are satisfied with the EAROM not experiencing an active reset voltage unless the 5 volt operating potential Vo is present. As mentioned, the reset potential may also be used to supply the microprocessor 12 for a further savings.

What has been described is a novel protection circuit for an EAROM in which the reset potential is not permitted to become active unless the operating potential is present. It is recognized that numerous modifications in the described embodiment of the invention will be apparent to those skilled in the art without departing from its true spirit and scope. The invention is to be limited only as defined in the claims.

What is claimed is:

1. A protection circuit for a non-volatile memory comprising:
    means for developing an operating voltage for said memory;
    means for developing a reset voltage having an active range, for said memory, said reset voltage being higher than said operating voltage; and
    means for controlling the respective rise and fall times of said operating voltage and said reset voltage for assuring presence of said operating voltage when said reset voltage is in said active range.

2. The circuit of claim 1 further including a voltage regulator for producing said operating voltage and wherein said reset voltage developing means includes a device having a voltage reference greater than said regulated operating voltage.

3. The circuit of claim 2 further including a source of voltage potential supplying said voltage regulator and wherein said voltage reference device is connected in a resistive circuit across said voltage source.

4. The circuit of claim 3 further including storage capacitor means associated with said source of voltage and said voltage regulator.

5. The circuit of claim 4 further including clamping means for limiting said reset voltage to a fixed amount above said operating voltage.

6. A protection circuit for a non-volatile memory comprising:
    a source of supply voltage;
    a regulator coupled to said source of supply voltage for developing a regulated voltage;
    means for developing a reset voltage coupled to said source of supply voltage, said means including a zener diode having a reference potential greater than the voltage of said regulator;
    clamping means for limiting said reset voltage to a fixed amount above said regulated voltage; and
    means for controlling the rise and fall times of said reset voltage and said regulated voltage such that said regulated voltage is present when said reset voltage is active.

* * * * *